(12) United States Patent
Jeong

(10) Patent No.: US 10,306,820 B2
(45) Date of Patent: May 28, 2019

(54) SYSTEMS FOR PACKAGING ELECTRONIC DEVICES

(71) Applicant: Samsung Electronics Co., Ltd., Suwon-si, Gyeonggi-do (KR)

(72) Inventor: Byunggil Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 14/623,263

(22) Filed: Feb. 16, 2015

(65) Prior Publication Data

US 2016/0057868 A1 Feb. 25, 2016

(30) Foreign Application Priority Data

Aug. 21, 2014 (KR) .................. 10-2014-0109045

(51) Int. Cl.
| | |
|---|---|
| *H05K 3/30* | (2006.01) |
| *H05K 13/00* | (2006.01) |
| *H05K 13/04* | (2006.01) |
| *H05K 3/34* | (2006.01) |
| *B06B 1/02* | (2006.01) |

(52) U.S. Cl.
CPC ....... *H05K 13/0015* (2013.01); *H05K 3/3436* (2013.01); *H05K 13/046* (2013.01); *B06B 1/0292* (2013.01); *H05K 2201/10151* (2013.01); *H05K 2201/10734* (2013.01); *H05K 2203/167* (2013.01); *Y02P 70/613* (2015.11)

(58) Field of Classification Search
CPC .............. B06B 1/0292; H05K 13/0015; H05K 13/046; H05K 2201/10151; H05K 2201/10734; H05K 2203/167; H05K 3/3436

See application file for complete search history.

(56) References Cited

U.S. PATENT DOCUMENTS

| | | | | |
|---|---|---|---|---|
| 3,641,666 A * | 2/1972 | Scaminaci, Jr. | ..... | H01R 43/033 140/71 C |
| 5,173,766 A * | 12/1992 | Long | ....................... | H01L 21/50 257/668 |
| 5,742,168 A * | 4/1998 | Kiyokawa | .......... | G01R 1/06705 324/750.13 |
| 6,408,728 B1 * | 6/2002 | Tsuji | .................... | B26D 7/2614 83/687 |
| 6,618,922 B2 * | 9/2003 | Ohmi | .................... | F16K 27/003 269/37 |
| 7,431,584 B2 * | 10/2008 | Takei | ................ | H01L 21/67109 118/52 |

(Continued)

FOREIGN PATENT DOCUMENTS

KR 2010-0027653 A 3/2010

*Primary Examiner* — Minh Trinh

(57) ABSTRACT

A packaging system of an electronic device, in which the electronic device is mounted on a circuit board, may comprise: a first jig having a groove configured to contain the electronic device, the first jig having a surface on which a plurality of aligning posts are prepared to protrude; a circuit board supporting member connected to the circuit board to support the circuit board, the circuit board supporting member including a plurality of first guide holes into which the aligning posts are inserted; and/or a second jig configured to apply pressure to the circuit board and including a plurality of second guide holes into which the aligning posts are inserted.

7 Claims, 7 Drawing Sheets

(56) References Cited

U.S. PATENT DOCUMENTS

| | | | | |
|---|---|---|---|---|
| 7,676,908 B2* | 3/2010 | Hayama | ............ | G01R 31/2887 |
| | | | | 29/747 |
| 8,119,426 B2* | 2/2012 | Kobayashi | .......... | B81C 1/00214 |
| | | | | 257/E21.529 |
| 8,723,538 B2* | 5/2014 | Hung | ................ | G01R 1/07371 |
| | | | | 324/750.16 |
| 8,732,941 B2* | 5/2014 | Schuetz | ............... | H01R 43/205 |
| | | | | 29/729 |
| 2005/0229914 A1* | 10/2005 | Umahashi | ............ | B25B 11/005 |
| | | | | 125/13.01 |
| 2006/0125501 A1* | 6/2006 | Liu | .................... | G01R 31/2889 |
| | | | | 324/750.25 |
| 2009/0056111 A1* | 3/2009 | Muren | ................... | H05K 3/303 |
| | | | | 29/739 |
| 2009/0135573 A1* | 5/2009 | Sato | ....................... | H05K 1/144 |
| | | | | 361/803 |
| 2010/0280388 A1 | 11/2010 | Huang | | |
| 2013/0341303 A1 | 12/2013 | Kim et al. | | |
| 2014/0102204 A1 | 4/2014 | Akiyama et al. | | |
| 2016/0057868 A1* | 2/2016 | Jeong | ................ | H05K 13/0015 |
| | | | | 29/594 |

\* cited by examiner

SYSTEMS FOR PACKAGING ELECTRONIC DEVICES

RELATED APPLICATION

This application claims priority from Korean Patent Application No. 10-2014-0109045, filed on Aug. 21, 2014, in the Korean Intellectual Property Office (KIPO), the entire contents of which are incorporated herein by reference.

BACKGROUND

1. Field

Example embodiments may relate generally to systems and methods for packaging electronic devices, by which the electronic devices may be mounted on circuit boards.

2. Description of Related Art

Electroacoustic transducers, which may convert electric energy into acoustic energy or convert acoustic energy into electric energy, may include an ultrasonic transducer and a microphone. A micromachined electroacoustic transducer may be a transducer using a Micro-Electro-Mechanical System (MEMS). A typical example of the micromachined electroacoustic transducer may be a micromachined ultrasonic transducer (MUT). MUTs may be capable of converting an electric signal into an ultrasonic signal, or converting an ultrasonic signal into an electric signal, and may be divided into piezoelectric MUTs (pMUTs), capacitive MUTs, (cMUTs), and magnetic MUTs (mMUTs) depending on modes of conversion. Among these, cMUTs have attracted much attention in the field of medical imaging diagnosis devices and sensors.

SUMMARY

Some example embodiments may provide systems and methods for packaging electronic devices, by which the electronic devices may be mounted on circuit boards.

In some example embodiments, a packaging system of an electronic device, in which the electronic device is mounted on a circuit board, may comprise: a first jig having a groove configured to contain the electronic device, the first jig having a surface on which a plurality of aligning posts are prepared to protrude; a circuit board supporting member connected to the circuit board to support the circuit board, the circuit board supporting member including a plurality of first guide holes into which the aligning posts are inserted; and/or a second jig configured to apply pressure to the circuit board and including a plurality of second guide holes into which the aligning posts are inserted.

In some example embodiments, the second jig may further include an opening configured to transmit heat.

In some example embodiments, the electronic device may include a capacitive micromachined ultrasonic transducer (cMUT).

In some example embodiments, the cMUT may be prepared within the groove of the first jig such that a membrane of the cMUT faces a bottom of the groove of the first jig.

In some example embodiments, a groove or through hole may be formed in the bottom of the groove of the first jig to expose the membrane of the cMUT.

In some example embodiments, the system may further comprise: a third jig including a plurality of third guide holes into which the aligning posts are inserted, and an opening into which a body block is inserted.

In some example embodiments, some of the aligning posts may penetrate the circuit board.

In some example embodiments, the circuit board supporting member may further include a polygonal ring connected to the circuit board. The first guide hole may be formed in at least one vertex of the polygonal ring.

In some example embodiments, a method of packaging an electronic device, by using the packaging system, may comprise: placing the electronic device within the groove of the first jig; placing the circuit board on the electronic device by inserting the aligning posts of the first jig into the first guide holes of the circuit board supporting member; and/or applying, by using the second jig, pressure to the circuit board by inserting the aligning posts of the first jig into the second guide holes of the second jig.

In some example embodiments, the second jig may include an opening configured to transmit heat. The method may further comprise bonding the electronic device and the circuit board by applying the heat through the opening of the second jig.

In some example embodiments, the method may further comprise: separating the circuit board from the circuit board supporting member after the bonding of the electronic device and the circuit board.

In some example embodiments, the packaging system may further comprise a third jig including a plurality of third guide holes into which the aligning posts are inserted, and an opening into which a body block is inserted. The method may further comprise: inserting the aligning posts into the third guide holes of the third jig; and/or placing the body block on the circuit board through the opening of the third jig.

In some example embodiments, some of the aligning posts may penetrate the circuit board.

In some example embodiments, the electronic device may include a capacitive micromachined ultrasonic transducer (cMUT).

In some example embodiments, the cMUT may be prepared within the groove of the first jig such that a membrane of the cMUT faces a bottom of the groove of the first jig.

In some example embodiments, a groove or through hole may be formed in the bottom of the groove of the first jig to expose the membrane of the cMUT.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
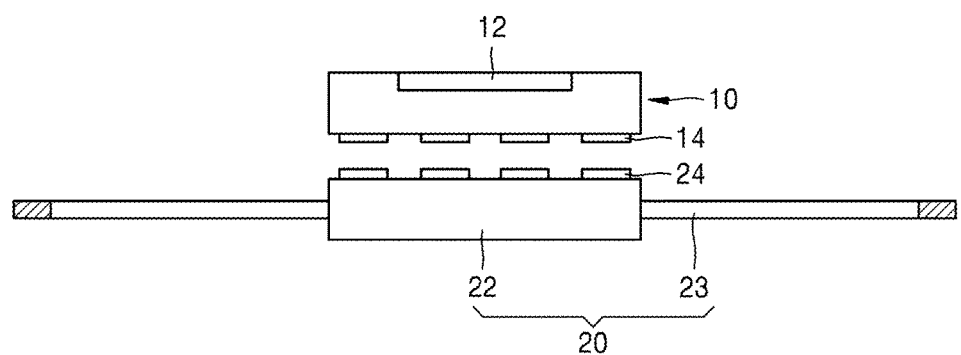
FIG. 1 is a diagram of an example embodiment in which a capacitive micromachined ultrasonic transducer (cMUT) is mounted on a circuit board.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made to example embodiments, which are illustrated in the accompanying drawings, wherein like reference numerals may refer to like components throughout.

FIG. 1 is a diagram of an example embodiment in which a capacitive micromachined ultrasonic transducer (cMUT) 10 is mounted on a circuit board 20. Referring to FIG. 1, the cMUT 10 may include a membrane 12, which may react to external oscillation and generate an electric signal or convert an electric signal into oscillation. Also, the cMUT 10 may include a conductive pattern 14 for connection to the circuit board 20. Although FIG. 1 illustrates only one cMUT 10 as an example, a plurality of cMUTs 10 may constitute one element and be connected to the circuit board 20. Furthermore, a plurality of elements may constitute a 1-dimensional or 2-dimensional array and be connected to the circuit board 20.

The circuit board 20 may include a substrate 22 connected to the cMUT 10, and a flexible substrate 23 configured to exchange electric signals with an external device. The substrate 22 connected to the cMUT 10 may include a conductive pattern 24 corresponding to the conductive pattern 14 of the cMUT 10 to exchange electric signals with the cMUT 10. The flexible substrate 23 may be formed of a flexible material and exchange electric signals with another external device.

Figure 2:
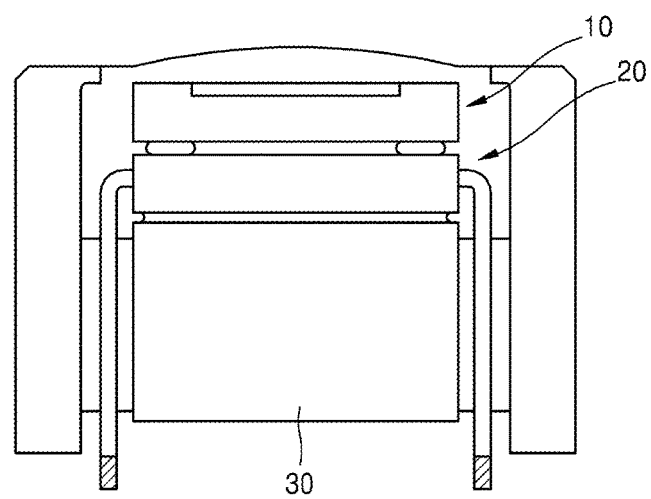
FIG. 2 is a diagram of an example in which a cMUT and a circuit board are combined and mounted in a device.

FIG. 2 is a diagram of an example in which a cMUT 10 and a circuit board 20 are combined and mounted in a device.

Referring to FIG. 2, the cMUT 10 and the circuit board 20 may be combined and mounted in the device. A body block 30 may be provided on a rear surface of the circuit board 20 to support the circuit board 20 and the cMUT 10. A surface of the cMUT 10 may be covered with a cover serving as a lens configured to appropriately control a direction of ultrasonic waves. A membrane 12 of the cMUT 10 may react to externally transmitted ultrasonic waves or oscillatory waves and move. Thus, the cMUT 10 may receive ultrasonic waves or oscillatory waves through the cover having a lens shape disposed on a front surface of the cMUT 10, and convert the ultrasonic waves or oscillatory waves into an electric signal. The electric signal may be transmitted to the circuit board 20. Also, the circuit board 20 may transmit the electric signal through the flexible substrate 23 to an external device. On the other hand, when the circuit board 20 receives an electric signal from the external device and transmits the electric signal to the cMUT 10, the membrane 12 of the cMUT 10 may react to the electric signal, move, and generate ultrasonic waves.

Figure 3:
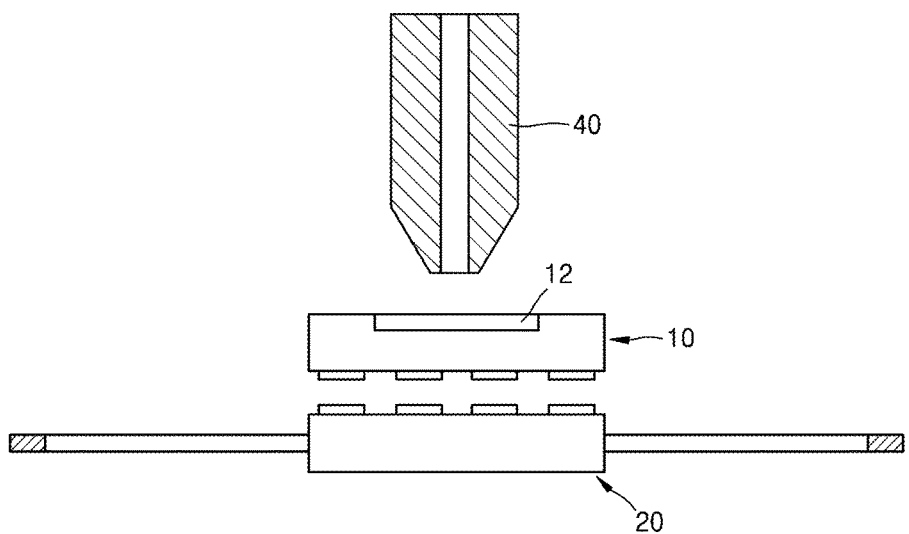
FIG. 3 is a diagram for explaining problems caused when a cMUT and a circuit board are combined.

FIG. 3 is a diagram for explaining problems caused when a cMUT 10 and a circuit board 20 are combined.

Referring to FIG. 3, when the cMUT 10 is mounted on the circuit board 20, a suction mechanism 40 may be used. The suction mechanism 40 may suck the cMUT 10 by using vacuum and move the cMUT 10 to a desired position. When the suction mechanism 40 is used, the cMUT 10 may be moved and mounted on the circuit board 20. However, a membrane 12 of the cMUT 10 is likely to be damaged during a process of maintaining vacuum. Also, a conductive pattern 14 disposed on a bottom surface of the cMUT 10 may not conform to a conductive pattern 24 of the circuit board 20, and errors may occur during the application of an electric signal.

Figure 4:
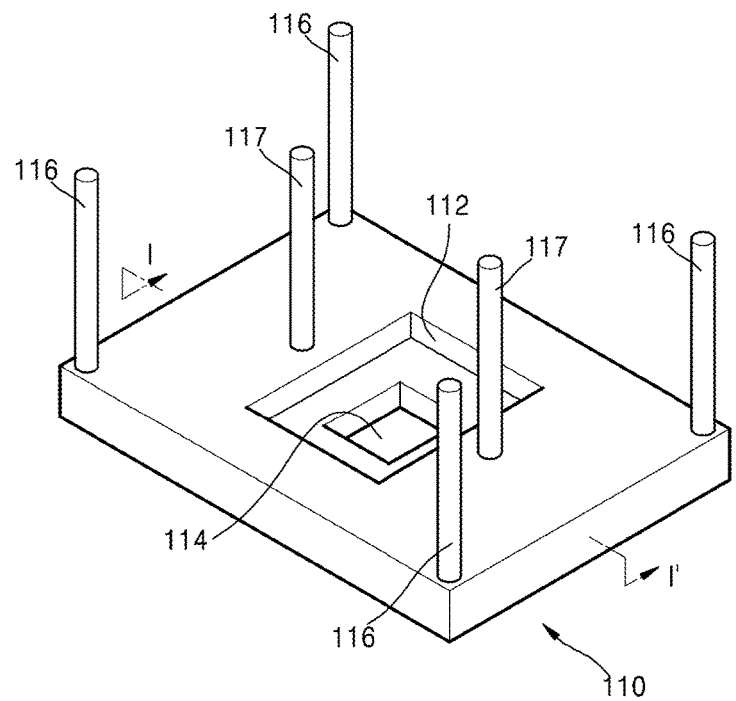
FIG. 4 is a perspective view of a first jig of a packaging system of an electronic device according to some example embodiments.

FIG. 4 is a perspective view of a first jig 110 of a packaging system of an electronic device, according to some example embodiments. Hereinafter, a cMUT 10 will be described as an example of the electronic device. Referring to FIG. 4, a plurality of aligning posts, namely, first and second aligning posts 116 and 117, may be prepared to protrude on one surface of the first jig 110. Here, the aligning posts may include at least one first aligning post 116 and at least one second aligning post 117. The first aligning post 116 may be inserted into a first guide hole 122 (refer to FIG. 6) of a circuit board supporting member 120 (refer to FIG. 6) as described below, and the second aligning post 117 may be inserted into a guide hole 28 formed in the circuit board 20 (refer to FIG. 6). The circuit board 20 may be placed in an appropriate position of the cMUT 10 by the first and second aligning posts 116 and 117. Although FIG. 4 illustrates both the first aligning posts 116 inserted in first guide holes 122 and the second aligning posts 117 inserted in the circuit board 20, both the first and second aligning posts 116 and 117 may not be provided. For example, when the guide hole 28 is not formed in the circuit board 20, only the first aligning posts 116 may be formed in the first jig 110 and inserted in the first guide holes 122.

A groove 112 configured to contain the cMUT 10 may be formed in the first jig 110. A shape of the groove 112 may correspond to a shape of the cMUT 10 contained therein. Also, a position of the groove 112 may be determined in consideration of a position in which the circuit board 20 is mounted on the cMUT 10. That is, the position of the groove 112 may be determined such that the circuit board 20 is placed in an appropriate position of the cMUT 10.

Figure 5:
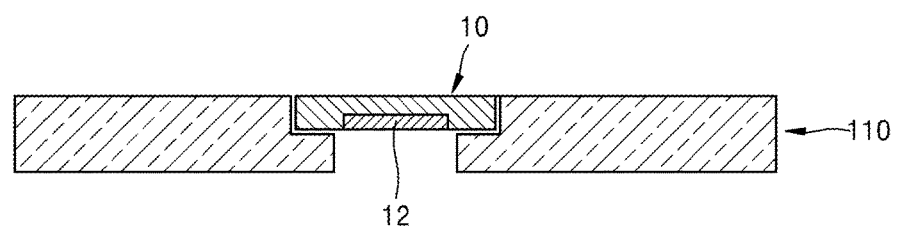
FIG. 5 is a cross-sectional view taken along line I-I' of FIG. 4 when a cMUT is contained in a groove of the first jig.

FIG. 5 is a cross-sectional view taken along line I-I' of FIG. 4 when the cMUT 10 is contained in the groove 112 of the first jig 110.

Referring to FIG. 5, the cMUT 10 may be contained in the groove 112 of the first jig 110. In this case, the cMUT 10 may be prepared within the groove 112 of the first jig 110 such that the membrane 12 faces a bottom surface of the groove 112 of the first jig 110. Also, referring back to FIG. 4, a through hole 114 may be formed in the bottom surface of the groove 112 of the first jig 110 to expose the membrane 12 of the cMUT 10. Instead of the through hole 114, a groove (not shown) for exposing the membrane 12 may be formed to a desired depth (that may or may not be predetermined) in the bottom surface of the groove 112 of the first jig 110. By exposing the membrane 12 through the groove (not shown) or the through hole 114, damage to the membrane 12 of the cMUT 10 may be prevented.

Figure 6:
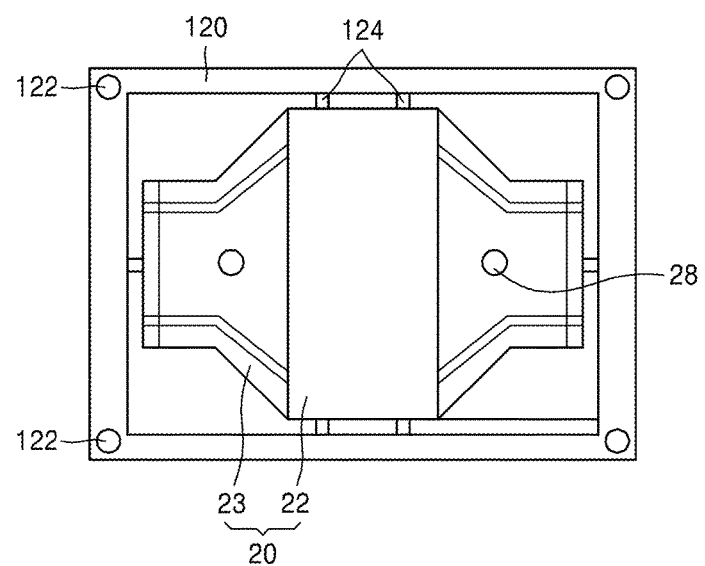
FIG. 6 is a plan view of a circuit board supporting member of a packaging system according to some example embodiments.

FIG. 6 is a plan view of a circuit board supporting member 120 of a packaging system according to some example embodiments.

Referring to FIG. 6, the circuit board supporting member 120 may be connected to a circuit board 20 and support the circuit board 20. A plurality of first guide holes 122 may be formed in the circuit board supporting member 120. The first aligning posts 116 of the first jig 110 shown in FIG. 4 may be inserted into the plurality of first guide holes 122, respectively. That is, as described below, the first aligning posts 116 of the first jig 110 may be inserted into the first guide holes 122 of the circuit board supporting member 120 so that the circuit board 20 may be mounted in an appropriate position of a cMUT 10. Meanwhile, guide holes 28 may be further formed in the circuit board 20, and the second aligning posts 117 of the first jig 110 may be inserted into the guide holes 28.

The circuit board supporting member 120 may be connected to the circuit board 20 through a connection unit 124 prepared to be easily cut. By cutting the connection unit 124 after the circuit board 20 is mounted in the cMUT 10, the circuit board 20 may be separated from the circuit board supporting member 120. That is, after the packaging of the cMUT 10 and the circuit board 20 is completed, the circuit board supporting member 120 may be removed from the circuit board 20. The removal process may be performed after or before the body block 30 is combined with the circuit board 20. Although FIG. 6 illustrates an example in which the circuit board supporting member 120 includes a square ring, the present disclosure is not limited thereto. For example, the circuit board supporting member 120 may include a circular ring, a polygonal ring, or a ring having an arbitrary shape. When the circuit board supporting member 120 includes a polygonal ring, the first guide hole 122 may be formed in at least one of the vertexes of the polygonal ring.

Figure 7:
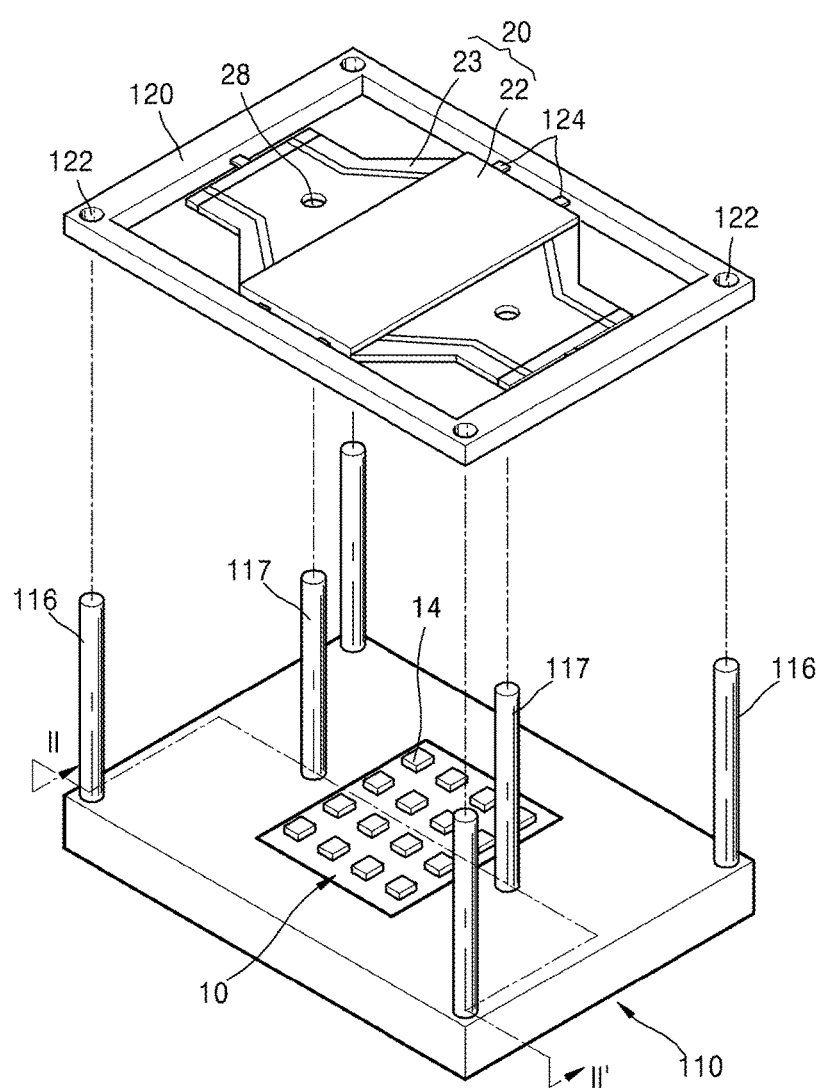
FIG. 7 is a diagram of a state in which a circuit board is placed on a cMUT.

FIG. 7 is a diagram of a state in which a circuit board 20 is placed on a cMUT 10.

Referring to FIG. 7, first aligning posts 116 may be respectively inserted into first guide holes 122 of a circuit board supporting member 120. Also, second aligning posts 117 may be respectively inserted into guide holes 28 of the circuit board 20. When the first and second aligning posts 116 and 117 are respectively inserted into the first guide holes 122 and the guide holes 28, the circuit board supporting member 120 may approach the first jig 110, or the first jig 110 may approach the circuit board supporting member 120. As shown in FIG. 7, the first and second aligning posts 116 and 117 may be respectively inserted into the first guide holes 122 and the guide holes 28 so that the circuit board 20 may be placed in an appropriate position of the cMUT 10. That is, a conductive pattern 14 of the cMUT 10 may conform to a conductive pattern 24 of the circuit board 20.

Figure 8:
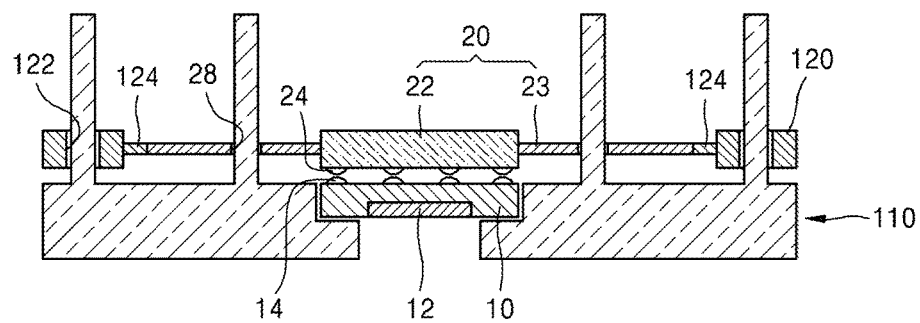
FIG. 8 is a cross-sectional view taken along line II-II' of FIG. 7 when a circuit board supporting member is placed on a first jig.

FIG. 8 is a cross-sectional view taken along line II-II' of FIG. 7 when the circuit board supporting member 120 is placed on the first jig 110.

Referring to FIG. 8, a circuit board 20 may be placed on a cMUT 10. In this case, the conductive pattern 14 of the cMUT 10 may conform to the conductive pattern 24 of the circuit board 20. The conductive patterns 14 and 24 may include solders, which may be bonded to each other using a heating process. The cMUT 10 may be combined with the circuit board 20 by bonding the solders of the conductive patterns 14 and 24.

Figure 9:
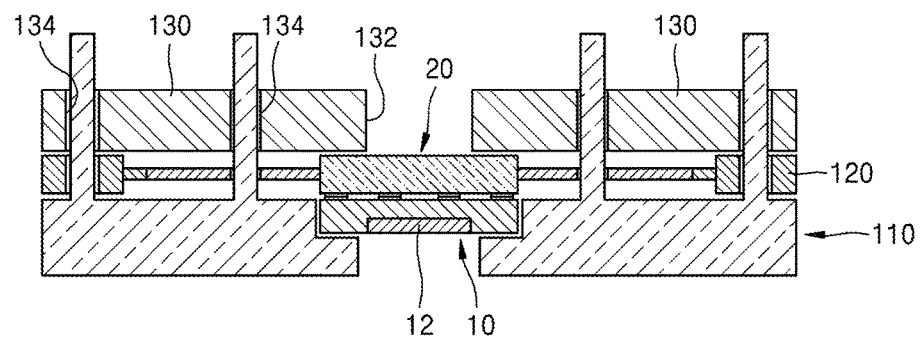
FIG. 9 is a cross-sectional view of a process of combining a cMUT and a circuit board.

FIG. 9 is a cross-sectional view of a process of combining a cMUT 10 and a circuit board 20.

Referring to FIG. 9, a packaging system according to some example embodiments may be prepared to apply pressure to the circuit board 20. The packaging system may further include a second jig 130 including a plurality of second guide holes 134 into which first and second aligning posts 116 and 117 are inserted. The first and second aligning posts 116 and 117 may be inserted into the second guide holes 134 so that the second jig 130 may be placed on the circuit board 20 and a circuit board supporting member 120. The second jig 130 may press the circuit board 20 so that the circuit board 20 may be bonded to the cMUT 10. Also, the second jig 130 may include an opening 132 to transmit heat to a conductive pattern 14 of the cMUT 10 and a conductive pattern 24 of the circuit board 20. When heat is transmitted through the opening 132 of the second jig 130, the conductive patterns 14 and 24 may undergo a reflow soldering process. The conductive patterns 14 and 24 may be bonded to each other by the reflow soldering process.

Figure 10:
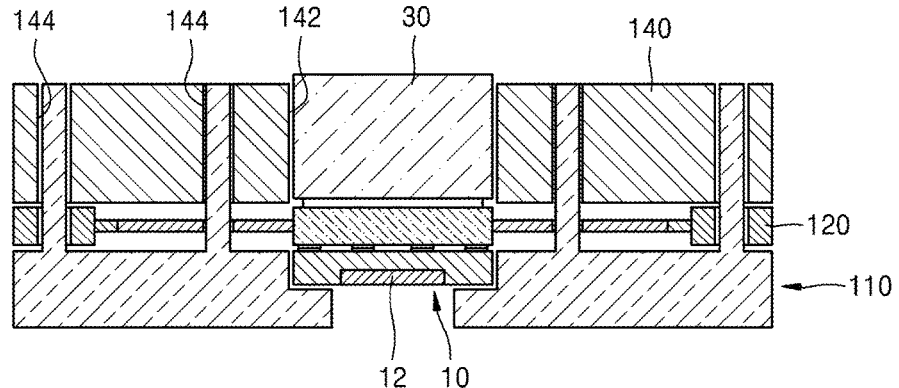
FIG. 10 is a cross-sectional view of a process of placing a body block on a circuit board and combining the body block and the circuit board.

FIG. 10 is a cross-sectional view of a process of placing a body block 30 on a circuit board 20 and combining the body block 30 and the circuit board 20.

Referring to FIG. 10, a packaging system according to some example embodiments may include a third jig 140 including a plurality of third guide holes 144 into which first and second aligning posts 116 and 117 are inserted, and an opening 142 into which the body block 30 is inserted. The first and second aligning posts 116 and 117 may be respectively inserted into the third guide holes 144 so that the third jig 140 may be placed on the circuit board 20 and a circuit board supporting member 120. The third jig 140 may be placed after the above-described second jig 130 is removed. A shape of the opening 142 formed in the third jig 140 may correspond to a shape of the body block 30. Accordingly, the body block 30 may be placed on the circuit board 20 and combined with the circuit board 20 through the opening 142 of the third jig 140. The combining process may be performed using an adhesive or the above-described reflow soldering process.

The packaging system of an electronic device according to the above-described example embodiments may include the first jig 110 including the groove 112 in which the cMUT 10 is contained, and the plurality of first and second aligning post 116 and 117 protruding on one surface of the first jig 110, the circuit board supporting member 120 connected to the circuit board 20 to support the circuit board 20 and including the plurality of first guide holes 122 into which the first aligning posts 116 are inserted, and the second jig 130 configured to apply pressure to the circuit board 20 and including the plurality of second guide holes 134 into which the first aligning posts 116 are inserted. Also, the packaging system may further include the third jig 140.

According to some example embodiments, an electronic device, such as the cMUT 10, may be precisely aligned without damage and placed on and bonded with the circuit board 20. Also, the body block 30 may be precisely and safely combined with the circuit board 20. A combination of the electronic device (e.g., cMUT 10), the circuit board 20, and the body block 30, which may be embodied by the packaging system, may be mounted on a device as shown in FIG. 2.

A packaging system of an electronic device has been described above. Hereinafter, a method of packaging an electronic device by using the packaging system will be described. All the above-described characteristics of the packaging system may be applied to the packaging method described below.

Figure 11:
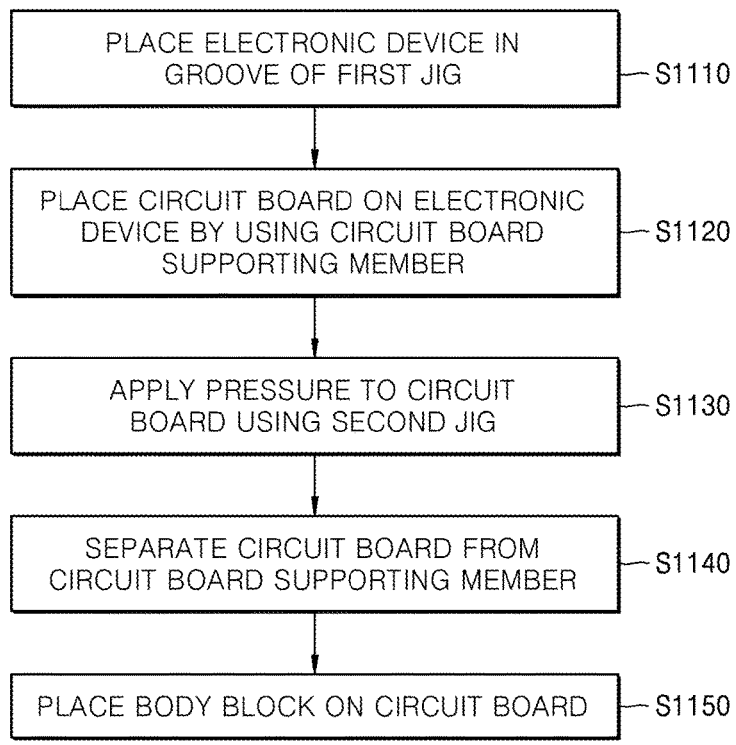
FIG. 11 is a flowchart of a method of packaging an electronic device according to some example embodiments.

FIG. 11 is a flowchart of a method 1100 of packaging an electronic device (e.g., cMUT 10), according to some example embodiments. The flowchart of FIG. 11 will be described with reference back to FIGS. 1 through 10.

Referring to FIG. 11, the method 1100 of packaging the electronic device, according to some example embodiments, may include placing the electronic device (e.g., cMUT 10) in the groove 112 of the first jig 110 (S1110), placing the circuit board 20 on the electronic device (e.g., cMUT 10) by respectively inserting the first aligning posts 116 of the first jig 110 into the first guide holes 122 of the circuit board supporting member 120 (S1120), and applying, by the second jig 130, pressure to the circuit board 20 by inserting the first and second aligning posts 116 and 117 of the first jig 110 into the second guide holes 134 of the second jig 130 (S1130).

Although not shown in FIG. 11, the method 1100 may include bonding the electronic device (e.g., cMUT 10) and the circuit board 20 by applying heat through an opening of the second jig 130. Also, the method 1100 may further include separating the circuit board 20 from the circuit board supporting member 120 (S1140) after bonding the electronic device (e.g., cMUT 10) and the circuit board 20.

Furthermore, the method 1100 may further include respectively inserting the first and second aligning posts 116 and 117 into the third guide holes 144 of the third jig 140 and placing the body block 30 on the electronic device (e.g., cMUT 10) through the opening 142 of the third jig 140 (S1150). As described above, the operation S1140 of separating the circuit board 20 from the circuit board supporting member 120 and the operation S1150 of placing the body block 30 on the electronic device (e.g., cMUT 10) may be performed in reverse order.

The system and method 1100 for packaging the electronic device, by which the electronic device is mounted on the circuit board 20, have been described thus far. Although a case in which the electronic device is the cMUT 10 is mainly described with respect to the drawings, example embodiments are not limited thereto. According to some example embodiments, the electronic device may be precisely aligned without damage and placed on and bonded to the circuit board 20.

It should be understood that the example embodiments described herein should be considered in a descriptive sense only and not for purposes of limitation. Descriptions of features or aspects within each embodiment should typically be considered as available for other similar features or aspects in other embodiments.

Although example embodiments have been shown and described, it would be appreciated by those skilled in the art that changes may be made in these example embodiments without departing from the principles and spirit of the disclosure, the scope of which is defined by the claims and their equivalents.

What is claimed is:

1. A packaging system of an electronic device, in which the electronic device is mounted on a circuit board, the system comprising:
   a first jig having a groove configured to contain the electronic device;
   a plurality of aligning posts protruding from a surface of the first jig;
   a circuit board supporting member connected to the circuit board to support the circuit board, the circuit board supporting member including a plurality of first guide holes into which the plurality of aligning posts are inserted, wherein the circuit board supporting member is disposed between the first jig and a second jig;
   the second jig configured to apply pressure to the circuit board and including a plurality of second guide holes into which the plurality of aligning posts are inserted; and
   a third jig including a plurality of third guide holes into which the plurality of aligning posts are inserted, and an opening into which a body block is inserted.

2. The system of claim 1, wherein the second jig further includes an opening configured to transmit heat.

3. The system of claim 1, wherein the electronic device includes a capacitive micromachined ultrasonic transducer (cMUT).

4. The system of claim 3, wherein the cMUT is prepared within the groove of the first jig such that a membrane of the cMUT faces a bottom of the groove of the first jig.

5. The system of claim 4, wherein a groove or through hole is formed in the bottom of the groove of the first jig to expose the membrane of the cMUT.

6. The system of claim 1, wherein some of the plurality of aligning posts penetrate the circuit board.

7. The system of claim 1, wherein the circuit board supporting member further includes a polygonal ring connected to the circuit board, and
   wherein the first guide hole is formed in at least one vertex of the polygonal ring.

* * * * *